(12) United States Patent
Okuno et al.

(10) Patent No.: US 9,070,495 B2
(45) Date of Patent: Jun. 30, 2015

(54) SUPERCONDUCTING WIRE MATERIAL AND METHOD FOR MANUFACTURING SUPERCONDUCTING WIRE MATERIAL

(75) Inventors: Yoshikazu Okuno, Tokyo (JP); Hiroyuki Fukushima, Tokyo (JP); Eiji Kojima, Tokyo (JP); Yuko Hayase, Tokyo (JP)

(73) Assignee: FUKUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 13/813,748

(22) PCT Filed: Nov. 24, 2011

(86) PCT No.: PCT/JP2011/077096
§ 371 (c)(1),
(2), (4) Date: Feb. 1, 2013

(87) PCT Pub. No.: WO2012/070631
PCT Pub. Date: May 31, 2012

(65) Prior Publication Data
US 2013/0157866 A1      Jun. 20, 2013

(30) Foreign Application Priority Data

Nov. 26, 2010   (JP) ................................. 2010-263910

(51) Int. Cl.
*H01B 12/02*       (2006.01)
*H01L 39/24*       (2006.01)
(Continued)

(52) U.S. Cl.
CPC ................ *H01B 12/06* (2013.01); *B82Y 30/00* (2013.01); *C01G 3/00* (2013.01); *C01G 45/1264* (2013.01);
(Continued)

(58) Field of Classification Search
CPC ... H01L 39/126; H01L 39/24; H01L 39/2461; H01B 12/06; C01G 45/1264; C01G 1/00; C30B 29/22

USPC ......... 505/203, 237, 238, 239, 434, 470, 704; 428/472, 701, 702, 930; 174/125.1; 427/62
See application file for complete search history.

(56) References Cited

U.S. PATENT DOCUMENTS 6,764,770 B2 *   7/2004   Paranthaman et al. ....... 428/469

FOREIGN PATENT DOCUMENTS

JP    2010 103021       5/2010
JP    2010-103021   *   5/2010   ............. H01B 12/06
(Continued)

OTHER PUBLICATIONS

U.S. Appl. No. 13/813,849, filed Feb. 1, 2013, Kasahara, et al.
(Continued)

*Primary Examiner* — Stanley Silverman
*Assistant Examiner* — Kallambella Vijayakumar
(74) *Attorney, Agent, or Firm* — Oblon, McClelland, Maier & Neustadt, L.L.P.

(57) ABSTRACT

Impurities in an oxide superconducting layer or at a surface of the oxide superconducting layer at an intermediate layer side are reduced. A superconducting wire rod has a configuration that includes a metal substrate 10; an intermediate layer 20 formed on the metal substrate 10 and containing a rare-earth element that reacts with Ba; a reaction suppressing layer 28 formed on the intermediate layer 20 and mainly containing $LaMnO_{3+\delta 1}$, wherein $\delta 1$ represents an amount of non-stoichiometric oxygen; and an oxide superconducting layer 30 formed on the reaction suppressing layer 28 and mainly containing an oxide superconductor containing Ba.

19 Claims, 3 Drawing Sheets

(51) Int. Cl.
*H01B 13/00* (2006.01)
*H01B 12/06* (2006.01)
*B82Y 30/00* (2011.01)
*C01G 3/00* (2006.01)
*C01G 45/12* (2006.01)
*H01L 39/14* (2006.01)
*H01B 13/32* (2006.01)

(52) U.S. Cl.
CPC ......... *C01P 2004/62* (2013.01); *C01P 2004/64* (2013.01); *H01L 39/24* (2013.01); *H01L 39/143* (2013.01); *H01L 39/2461* (2013.01); *H01B 13/32* (2013.01); *C01P 2002/76* (2013.01)

(56) References Cited

FOREIGN PATENT DOCUMENTS

| | | | | |
|---|---|---|---|---|
| JP | 2011 9106 | | 1/2011 | |
| JP | 2011-009106 | * | 1/2011 | ............ H01B 12/06 |
| JP | 2011 138689 | | 7/2011 | |

OTHER PUBLICATIONS

U.S. Appl. No. 13/814,580, filed Feb. 6, 2013, Hayase, et al.
International Search Report Issued Dec. 27, 2011 in PCT/JP11/77096 Filed Nov. 24, 2011.

* cited by examiner

SUPERCONDUCTING WIRE MATERIAL AND METHOD FOR MANUFACTURING SUPERCONDUCTING WIRE MATERIAL

TECHNICAL FIELD

The present invention relates to a superconducting wire rod used for a superconducting cable, a superconducting magnet and the like, and a method for manufacturing thereof.

BACKGROUND ART

Many attempts have been conventionally proposed to manufacture a superconducting wire rod by depositing an oxide superconductor on a substrate.

Among them, a superconducting wire rod obtained by depositing an oxide superconductor represented by a composition formula of $REBa_2Cu_3O_{7-\delta}$ (RE represents a rare-earth element; also referred to as 123-based or RE-based superconductor) on a tape-shaped metal substrate to have flexibility exhibits high current properties, and thus it is now one of superconducting wire rods on which research and development has been actively carried out. A number of prototypes for an electric power device or the like using such wire rods have already been manufactured.

The oxide superconductor has electrical anisotropy such that the flow of electricity is promoted along the crystal axes a and b of the crystals itself, but the flow of electricity is impended along the crystal axis c of the crystals itself. Accordingly, when the oxide superconductor is formed on a substrate, it is necessary to orient the crystal axes a and b so as to promote the flow of electricity and orient the crystal axis c along another direction.

However, the substrate itself is an amorphous material or polycrystalline material that has a crystal structure significantly different from that of the oxide superconductor. Therefore, it is difficult to form an oxide superconductor exhibiting high crystalline orientation on the substrate. Differences in coefficients of thermal expansion and lattice constants between the substrate and the oxide superconductor may cause distortion in the superconductor or peeling-off of the oxide superconductor film from the substrate during a cooling process to a superconducting critical temperature.

As an approach to address these problems, an orientation layer (i.e. intermediate layer) is first provided on a metal substrate, and an oxide superconductor is formed on the oriented layer. The oriented layer is deposited, for example, by an ion beam assisted deposition method (IBAD method) using a material such as MgO which exhibits high orientation of the crystal axis c and high in-plane orientation of the crystal axis a (i.e. biaxial crystal orientation).

Japanese Patent Application Laid-Open (JP-A) No. 2010-103021 discloses the technique to achieve a higher biaxial crystal orientation, in which a cap layer made of $CeO_2$, $PrO_2$ or the like is formed on an oriented layer, and then an oxide superconducting layer made of an RE-based superconductor containing Ba is formed thereon.

SUMMARY OF INVENTION

Technical Problem

However, in JP-A No. 2010-103021, since the cap layer made of $CeO_2$, $PrO_2$ or the like is disposed directly below the oxide superconducting layer, a rare-earth element contained in a constituent of the cap layer such as $CeO_2$ or $PrO_2$ may react with the Ba contained in the oxide superconducting layer during formation of the oxide superconducting layer or a heat treatment process of a superconducting wire rod. As a result, impurities such as $BaCeO_3$ or $BaPrO_3$ are generated in the oxide superconducting layer or at an interface between the oxide superconducting layer and the intermediate layer (i.e. the cap layer) (that is, a surface of the oxide superconducting layer at an intermediate layer side), which adversely affects superconducting properties such as a critical current.

The invention has been made in view of the aforementioned circumstances, and it is an object of the invention to provide a superconducting wire rod that contains fewer impurities in an oxide superconducting layer or at a surface of the oxide superconducting layer at an intermediate layer side, and a method for manufacturing the same.

Solution to Problem

The aforementioned problems can be solved by the following means.

<1> A superconducting wire rod including a metal substrate, an intermediate layer formed on the metal substrate and mainly containing a rare-earth element that reacts with Ba, a reaction suppressing layer formed on the intermediate layer and mainly containing $LaMnO_{3+\delta1}$, wherein $\delta1$ represents an amount of non-stoichiometric oxygen, and an oxide superconducting layer formed on the reaction suppressing layer and mainly containing an oxide superconductor containing Ba.

<2> The superconducting wire rod according to <1>, in which an outermost layer of the intermediate layer at an oxide superconducting layer side is a cap layer mainly containing at least one selected from $CeO_2$ or $PrO_2$.

<3> The superconducting wire rod according to <1> or <2>, in which the oxide superconductor is $REBa_2Cu_3O_{7-\delta2}$, wherein RE represents a single rare-earth element or a plurality of rare-earth elements and $\delta2$ represents an amount of non-stoichiometric oxygen.

<4> The superconducting wire rod according to any one of <1> to <3>, in which the reaction suppressing layer has a thickness of from 10 nm to 100 nm.

<5> The superconducting wire rod according to any one of <2> to <4>, in which the reaction suppressing layer is thinner than the cap layer.

<6> The superconducting wire rod according to any one of <1> to <5>, in which a crystal lattice of the $LaMnO_{3+\delta1}$ is a cubic or orthorhombic lattice.

<7> A method for manufacturing a superconducting wire rod, the method including: a step of forming, on a metal substrate, an intermediate layer containing a rare-earth element that reacts with Ba; a step of forming, on the intermediate layer, a reaction suppressing layer mainly containing $LaMnO_{3+\delta1}$, wherein $\delta1$ represents an amount of non-stoichiometric oxygen; and a step of forming, on the reaction suppressing layer, an oxide superconducting layer containing Ba.

Advantageous Effects of Invention

According to the invention, a superconducting wire rod that contains fewer impurities in an oxide superconducting layer or at a surface of the oxide superconducting layer at an intermediate layer side, and a method for manufacturing the same can be provided.

BEST MODE FOR CARRYING OUT THE INVENTION

Figure 1:
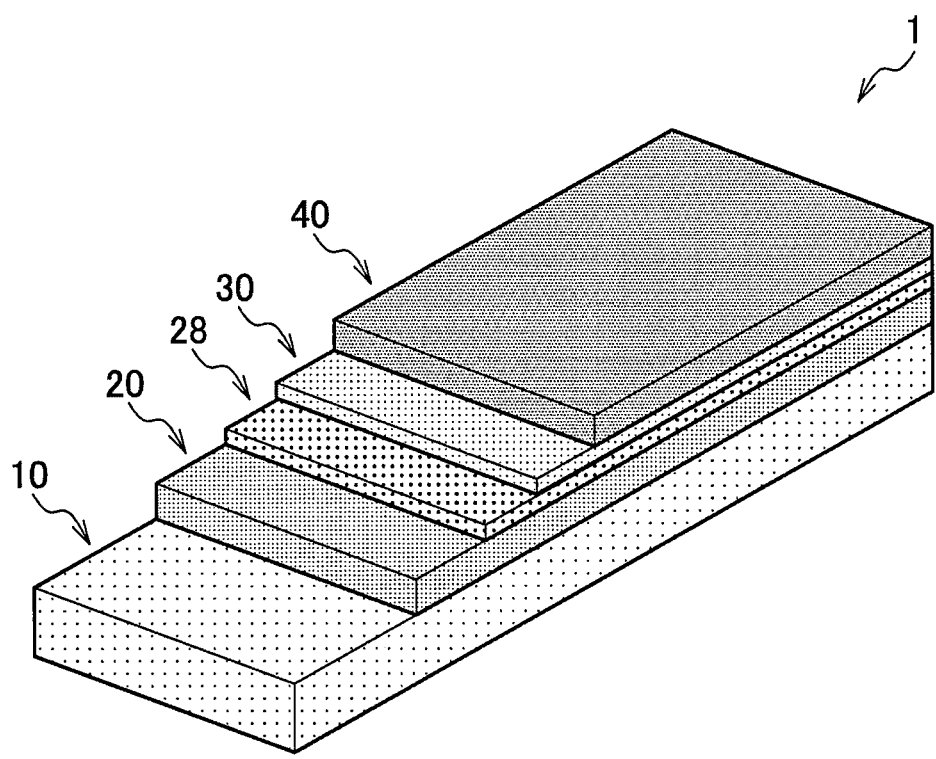
FIG. 1 is a diagram showing a multilayer configuration of a superconducting wire rod according to an embodiment of the invention.

Hereinbelow, a superconducting wire rod according to an embodiment of the invention and a method for manufacturing thereof are described in detail with reference to the drawings. In the drawings, members (components) having the same or corresponding functions are provided by the same reference marks and duplicating descriptions are properly omitted.

Configuration of Superconducting Wire Rod and Method for Manufacturing the Same

FIG. 1 is a diagram showing a multilayer configuration of a superconducting wire rod according to an embodiment of the invention.

As shown in FIG. 1, a superconducting wire rod 1 has a multilayer configuration in which an intermediate layer 20, a reaction suppressing layer 28, an oxide superconducting layer 30, and a protection layer 40 are formed in this order on a tape-shaped metal substrate 10.

The metal substrate 10 is a low-magnetic, non-oriented metal substrate. In addition to the tape-shaped metal substrate, various shapes of metal substrates such as board, wire, or streak material may be used as the metal substrate 10. As a material for the metal substrate 10, a metal having excellent strength and thermal resistance such as Cu, Cr, Ni, Ti, Mo, Nb, Ta, W, Mn, Fe or Ag, or an alloy thereof may be used. Among these, stainless steel, HASTELLOY (registered trademark) and other nickel alloys, which have excellent corrosion resistance and thermal resistance, are preferable. In addition, various conductive ceramic materials may be arranged on these metal materials.

The intermediate layer 20, which is formed on the metal substrate 10, is a layer for achieving high degrees of in-plane orientation in the oxide superconducting layer 30. The specific layer configuration thereof is described below.

The reaction suppressing layer 28 is a layer mainly containing $LaMnO_{3+\delta1}$ and suppresses the generation of impurities in the oxide superconducting layer or at a surface of the oxide superconducting layer 30 at a side of the intermediate layer 20. Here, $\delta1$ represents an amount of non-stoichiometric oxygen.

The oxide superconducting layer 30, which is formed on the reaction suppressing layer 28 formed on the intermediate layer 20, mainly contains an oxide superconductor containing Ba. As the oxide superconductor, a crystalline material represented by a composition formula of $REBa_2Cu_3O_{7-\delta}$, $(La_{1-x}Ba_x)_2CuO_{4-\delta}$, $Ba(Pb, Bi)O_3$, $Tl_2Ba_2Ca_{n-1}Cu_nO_{2n+4}$ (wherein n is an integer of 2 or more) or the like may be used. The oxide superconductor may contain a combination of these crystalline materials. Here, the expression "mainly contain(s)" indicates that the proportion of the oxide superconductor in the oxide superconducting layer 30 is 80% by mass or more.

In the above composition formula $REBa_2Cu_3O_{7-\delta}$, RE represents a single rare-earth element such as Y, Nd, Sm, Eu, Gd, Dy, Ho, Er, Tm, Yb or Lu, or plural rare-earth elements selected therefrom. Among these, due to the difficulty of substitution with a Ba site, Y is preferable. $\delta$ represents the amount of non-stoichiometric oxygen. For example, $\delta$ is from 0 to 1. In terms of achieving a high superconducting transition temperature, $\delta$ is preferably closer to 0. Although superconducting phenomena have not yet been observed in $PrBa_2Cu_3O_{7-\delta}$, in which RE in the above composition formula is Pr, if superconducting phenomena are observed in the future, for example, by controlling the amount of non-stoichiometric oxygen $\delta$, then $PrBa_2Cu_3O_{7-\delta}$ will be included in the oxide superconductor according to the embodiments of the invention.

In addition, $\delta$ of crystalline materials other than $REBa_2Cu_3O_{7-\delta}$ also represents the amount of non-stoichiometric oxygen. For example, $\delta$ is from 0 to 1.

The film thickness of the oxide superconducting layer 30 is not specifically limited. For example, the film thickness of the oxide superconducting layer 30 is from 100 nm to 6,000 nm.

Examples of a method of forming (depositing) the oxide superconducting layer 30 include a TFA-MOD method, a PLD method, a CVD method, an MOCVD method, and a sputtering method. Among these deposition methods, the MOCVD method is preferably used because there is no requirement of a high vacuum, and there is ease of increase in surface area, capability of deposition on the substrate 10 even when it has a complex shape, and excellent mass productivity. When the MOCVD method is used, the conditions for deposition are appropriately set in accordance with the constituent materials, film thickness or the like of the oxide superconducting layer 30. For example, deposition is conducted with a wire rod conveying speed of from 10 m/h to 500 m/h, and a deposition temperature of from 800° C. to 900° C. (in a case where $YBa_2Cu_3O_{7-\delta}$ is deposited). When depositing $REBa_2Cu_3O_{7-\delta}$ or $(La_{1-x}Ba_x)_2CuO_{4-\delta}$, the deposition is preferably conducted in an oxygen gas atmosphere in order to reduce the amount of non-stoichiometric oxygen $\delta$ and improve superconducting properties.

On an upper surface of the oxide superconducting layer 30, the protection layer 40 of silver may be deposited by, for example, a sputtering method. Following the deposition of the protection layer 40 to manufacture the superconducting wire rod 1, the obtained superconducting wire rod 1 may be subjected to a heat treatment.

Figure 2:
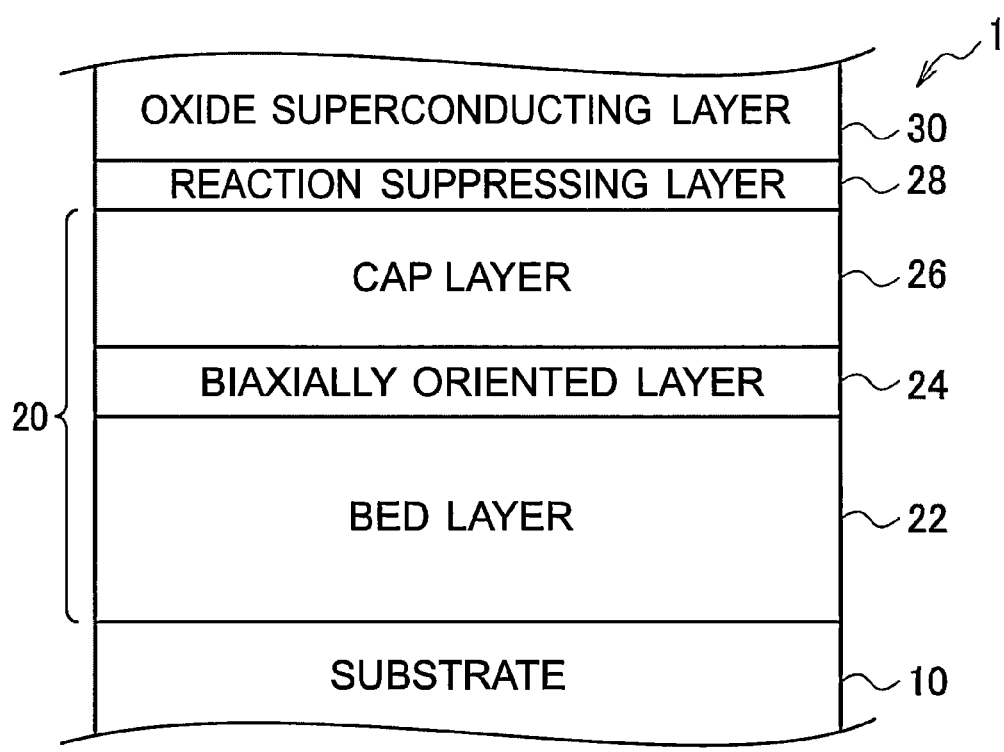
FIG. 2 is a detailed cross-sectional view of the multilayer configuration of the superconducting wire rod shown in FIG. 1.

Detailed Configuration of Superconducting Wire Rod and Method for Manufacturing the Same FIG. 2 is a detailed cross-sectional view of the multilayer configuration of the superconducting wire rod 1 shown in FIG. 1.

As shown in FIG. 2, the intermediate layer 20 of the superconducting wire rod 1 includes a bed layer 22, a biaxially-oriented layer 24, and a cap layer 26.

The bed layer 22, which is formed on the metal substrate 10, is a layer for preventing diffusion of constituent elements of the metal substrate 10. As a constituent material for the bed layer 22, for example, $Gd_2Zr_2O_{7-\delta}$ ($-1<\delta<1$, hereinafter referred to as GZO), $YAlO_3$ (yttrium aluminate), YSZ (yttria-stabilized zirconia), $Y_2O_3$, $Gd_2O_3$, $Al_2O_3$, $B_2O_3$, $Sc_2O_3$, $Cr_2O_3$, REZrO, or $RE_2O_3$ can be used. Here, RE represents a single rare-earth element or plural rare-earth elements. In addition to the diffusion prevention function, the bed layer 22 may have another function such as a function of improving biaxial orientation. In order to impart the function of improving biaxial orientation to the bed layer 22, GZO is preferably used as the constituent material for the bed layer 22.

The film thickness of the bed layer 22 is not specifically limited. For example, the film thickness of the bed layer 22 is from 20 nm to 200 nm.

Examples of a method of forming (depositing) the bed layer 22 include deposition using an RF sputtering method in an argon atmosphere.

In the RF sputtering method, inert gas ions (such as $Ar^+$) generated by plasma discharge are collided with an evaporation source (such as GZO) to sputter evaporated particles, which in turn deposit on a deposition area to form a film. In this case, the conditions for deposition are appropriately set in accordance with the constituent materials, film thickness or the like of the bed layer 22. For example, RF sputtering is conducted with RF sputtering output of from 100 W to 500 W, a wire rod conveying speed of from 10 m/h to 100 m/h, and a deposition temperature of from 20° C. to 500° C.

An ion-beam sputtering method in which ions generated by an ion generator (ion gun) are collided with an evaporation source may be used for deposition of the bed layer 22. The bed layer 22 may be a multilayer configuration such as a combination of an $Y_2O_3$ layer and an $Al_2O_3$ layer.

The biaxially-oriented layer 24, which is formed on the bed layer 22, is a layer for orienting crystals in the oxide superconducting layer 30 in a given direction. Examples of a constituent material for the biaxially-oriented layer 24 include polycrystalline materials such as NbO and MgO. Alternatively, the same material as that of the bed layer 22, such as GZO may be used.

The film thickness of the biaxially-oriented layer 24 is not specifically limited. For example, the film thickness of the biaxially-oriented layer 24 is from 1 nm to 20 nm.

Examples of a method of forming (depositing) the biaxially-oriented layer 24 include deposition using an IBAD method in an atmosphere of argon, oxygen, or mixed gas of argon and oxygen. In the IBAD method, evaporated particles sputtered from an evaporation source (such as MgO) by RF sputtering (or ion-beam sputtering) are deposited on a deposition area while being irradiated with an assisting ion beam at a tilted angle to form a film. In this case, the conditions for deposition are appropriately set in accordance with the constituent materials, film thickness or the like of the biaxially-oriented layer 24. For example, deposition is conducted with an assisting ion beam voltage of from 800 V to 1500 V, an assisting ion beam current of from 80 mA to 350 mA, an assisting ion beam accelerating voltage of 200 V, RF sputtering output of from 800 W to 1500 W, a wire rod conveying speed of from 40 m/h to 500 m/h, and a deposition temperature of from 5° C. to 350° C.

Alternatively, a reactive sputtering method may be used for deposition of the biaxially-oriented layer 24. In the reactive sputtering method, sputtering is performed with the use of Mg as an evaporation source in an atmosphere of mixed gas of argon and oxygen, and the sputtered Mg is reacted with oxygen to deposit MgO. The biaxially-oriented layer 24 may be a composite layer of a layer deposited by an epitaxial method and a layer deposited by an IBAD method.

The cap layer 26, which is formed on the biaxially-oriented layer 24, is a layer for protecting the biaxially-oriented layer 24 and also for achieving improved lattice matching with the oxide superconducting layer 30. Specifically, the cap layer 26 contains a rare-earth element that reacts with Ba and consists of a fluorite-type crystal structure having self-epitaxy. The fluorite-type crystal structure is at least one selected from $CeO_2$ or $PrO_2$, for example. Here, as long as the cap layer 26 is mainly composed of the fluorite-type crystal structure, the cap layer 26 may further contain impurities.

The film thickness of the cap layer 26 is not specifically limited. In order to ensure sufficient orientation, the film thickness of the cap layer 26 is preferably 50 nm or more, and more preferably 300 nm or more. However, the film thickness of the cap layer 26 is preferably 600 nm or less because the length of time required for deposition is increased when the film thickness thereof exceeds than 600 nm.

Examples of a method of forming (depositing) the cap layer 26 include deposition by a PLD method or an RF sputtering method. The deposition conditions for the RF sputtering method are appropriately set in accordance with the constituent materials, film thickness or the like of the cap layer 26. For example, deposition is conducted with RF sputtering output of 200 W to 1000 W, a wire rod conveying speed of from 2 m/h to 50 m/h, and a deposition temperature of from 450° C. to 800° C.

On the cap layer 26 that is the outermost layer of the intermediate layer 20 described above, the reaction suppressing layer 28 according to the embodiments of the invention is provided.

Specifically, the reaction suppressing layer 28 is formed between the oxide superconducting layer 30 and the cap layer 26 and functions as a layer for suppressing a reaction between the rare-earth element contained in the fluorite-type crystal structure constituting the cap layer 26 with the Ba contained in the oxide superconducting layer 30. Regarding the term of "suppress", as long as a reaction with Ba is suppressed compared to a case in which the reaction suppressing layer 28 is not formed between the oxide superconducting layer 30 and the cap layer 26, the reaction with Ba does not need to be completely prevented.

The reaction suppressing layer 28 may be a layer mainly containing $LaMnO_{3+\delta 1}$ (hereinafter referred to as LMO). Here, $\delta 1$ in $LaMnO_{3+\delta 1}$ represents an amount of non-stoichiometric oxygen. For example, $\delta 1$ is from 0 to 1. The expression "mainly" represents that the proportion of LMO in the reaction suppressing layer 28 is 80% by mass or more. In terms of reliably suppressing the reaction, it is preferable that the reaction suppressing layer 28 is made of LMO, that is, the proportion of LMO in the reaction suppressing layer 28 is 100% by mass.

The crystal structure of $LaMnO_{3+\delta 1}$ may be cubic, orthorhombic, or rhombohedral. In order to improve an orientation ratio of the upper layer (oxide superconducting layer 30), the cubic structure is preferable when the oxide superconducting layer 30 is formed thereon.

The film thickness of the reaction suppressing layer 28 is not specifically limited. In terms of effectively suppressing the reaction between the rare-earth element contained in the fluorite-type crystal structure constituting the cap layer 26 with the Ba contained in the oxide superconducting layer 30, the film thickness of the reaction suppressing layer 28 is preferably 10 nm or more. In terms of suppressing surface roughness of the reaction suppressing layer 28, the film thickness of the reaction suppressing layer 28 is preferably 100 nm or less. Although the reaction suppressing layer 28 exhibits high orientation similarly to the cap layer 26, it is preferable the reaction suppressing layer 28 is thinner than the cap layer 26 so as to reliably preserve the orientation of the cap layer 26 in the oxide superconducting layer 30.

It is preferable that, in the reaction suppressing layer 28, the amount of the rare-earth element that may react with the Ba is as small as possible. For example, the content of the rare-earth element in the reaction suppressing layer 28 is preferably 10% or less, more preferably 5% or less, and still more preferably 1% or less.

When the amount of the rare-earth element is within the above ranges, a reaction between the rare-earth element in the reaction suppressing layer 28 and the oxide superconducting layer 30 can be suppressed even when the rare-earth element contained in the fluorite-type crystal structure constituting the cap layer 26 penetrates into the reaction suppressing layer 28.

In terms of suppressing diffusion (passage through the reaction suppressing layer 28) of the rare-earth element contained in the fluorite-type crystal structure constituting the cap layer 26, it is preferable that a porosity of the reaction suppressing layer 28 is as low as possible. The porosity is preferably 5% or less, more preferably 1% or less, and still more preferably 0.1% or less, and further more preferably 0.01% or less.

Examples of a method of forming (depositing) the reaction suppressing layer 28 include deposition by a PLD method or a sputtering method. The deposition conditions by the sputtering method are appropriately set in accordance with the constituent materials, film thickness or the like of the reaction suppressing layer 28. For example, deposition is conducted with sputtering output of from 100 W to 200 W, a wire rod conveying speed of from 18 m/h to 180 m/h, a deposition temperature of from 600° C. to 900° C., and a deposition atmosphere of an Ar gas atmosphere of from 0.1 Pa to 1.0 Pa. A material not containing a rare-earth element that reacts with the Ba, in particular, the constituent material for the above-described reaction suppressing layer 28 is used as a target.

Effects

In the present embodiments, since the reaction suppressing layer 28 is formed between the oxide superconducting layer 30 and the cap layer 26 as described above, the rare-earth element that is contained in the fluorite-type crystal structure constituting the cap layer 26 is less diffused, and the reaction between the rare-earth element and the Ba contained in the oxide superconducting layer is suppressed. Therefore, the oxide superconducting layer 30 or the surface of the oxide superconducting layer 30 at a side of the cap layer 26 includes no impurities or fewer impurities compared with a case in which the reaction suppressing layer 28 is not formed.

Figure 3A:
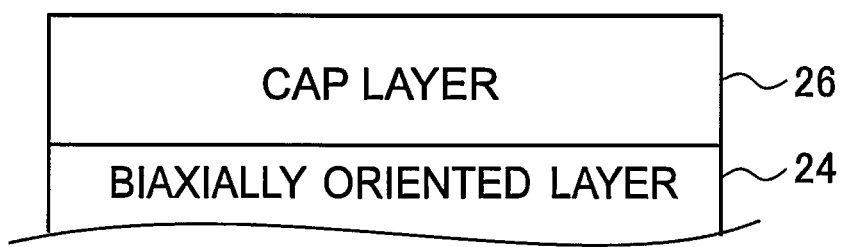
FIG. 3A is a diagram showing a manufacturing process and a multilayer configuration of a conventional superconducting wire rod.
Figure 3B:
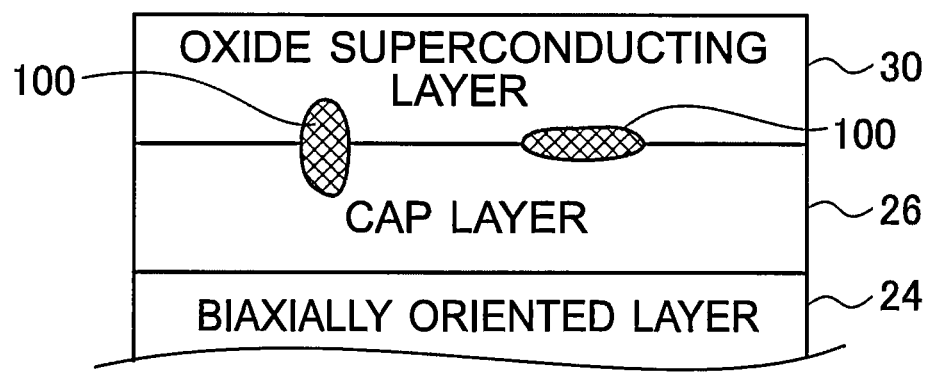
FIG. 3B is a diagram showing the manufacturing process and the multilayer configuration of the conventional superconducting wire rod following FIG. 3A.

When the reaction suppressing layer 28 is not formed, the reaction between the rare-earth element and the Ba contained in the oxide superconducting layer 30 may occur in a heat treatment process or during high temperature preservation after manufacturing the superconducting wire rod 1. In particular, as shown in FIGS. 3A and 3B, the reaction occurs during the formation of the oxide superconducting layer 30 in which the substrate 10 needs to be heated so as to increase the deposition temperature. A reference mark 100 in the Figure represents impurities generated by the reaction of the rare-earth element contained in the fluorite-type crystal structure constituting the cap layer 26 with the Ba contained in the oxide superconducting layer 30.

On the other hand, in the present embodiments, since the reaction suppressing layer 28 instead of the cap layer 26 is used as a underlying layer for forming the oxide superconducting layer 30, the above-described reaction can be suppressed during the formation of the oxide superconducting layer 30.

Modifications

Although the specific embodiments according to the invention have been set forth in detail, the invention in not limited thereto. It will however be obvious to those skilled in the art that other various embodiments are possible without departing from the scope of the invention. For example, the above-described plural embodiments may be appropriately combined with one another to implement the invention. Alternatively, the following modifications may be appropriately combined with one another.

A lattice matching layer containing at least one selected from LMO or STO may be provided between the biaxially-oriented layer 24 and the cap layer 26 so as to improve the lattice matching properties of the cap layer 26.

Although the case in which the amount of non-stoichiometric oxygen δ of the materials such as $YBa_2Cu_3O_{7-δ}$ is 0 or larger (positive value) has been described, the amount of non-stoichiometric oxygen δ may be a negative value.

An oriented metal substrate may be used as the metal substrate 10, and the intermediate layer 20 made of $CeO_2$ or $PrO_2$/YSZ/$CeO_2$ or $PrO_2$ may be formed on the metal substrate 10. In this case, the metal substrate 10 may be any in-plane oriented metal substrate and preferably a substrate made of Ag, Ni or an alloy thereof. The configuration of the intermediate layer 20 is not limited to the above-described configuration as long as the intermediate layer 20 can suppress a diffusion reaction between the metal substrate 10 and the oxide superconducting layer 30 and can control orientation of the oxide superconducting layer 30.

Moreover, another layer may be formed between the cap layer 26 and the reaction suppressing layer 28.

The disclosure of Japanese Patent Application No. 2010-263910 is incorporated by reference herein in its entirety.

All publications, patent applications, and technical standards mentioned in this specification are herein incorporated by reference to the same extent as if each individual publication, patent application, or technical standard was specifically and individually indicated to be incorporated by reference.

EXAMPLES

Hereinafter, the superconducting wire rod according to the invention and the method for manufacturing the same is described with reference to examples. However, the invention is not limited to these examples.

Examples and Comparative Examples are shown in Table 1.

TABLE 1

|  | Configuration | Film Thickness of Reaction Suppressing Layer (nm) | $BaGeO_3$ | Ra | Ic |
| --- | --- | --- | --- | --- | --- |
| Example | 1-1 YBCO/LMO/$CeO_2$/IBAD-GZO/Substrate | 5 | B | A | B |
|  | 1-2 YBCO/LMO/$CeO_2$/IBAD-GZO/Substrate | 10 | A | A | A |
|  | 1-3 YBCO/LMO/$CeO_2$/IBAD-GZO/Substrate | 30 | A | A | A |
|  | 1-4 YBCO/LMO/$CeO_2$/IBAD-GZO/Substrate | 60 | A | A | A |
|  | 1-5 YBCO/LMO/$CeO_2$/IBAD-GZO/Substrate | 80 | A | A | A |
|  | 1-6 YBCO/LMO/$CeO_2$/IBAD-GZO/Substrate | 100 | A | A | A |
|  | 1-7 YBCO/LMO/$CeO_2$/IBAD-GZO/Substrate | 180 | A | B | B |
|  | 2 YBCO/LMO/$CeO_2$/IBAD-MgO/GZO/Substrate | 60 | A | A | A |
|  | 3-1 YBCO/LMO/$CeO_2$/LMO/IBAD-MgO/GZO/Substrate | 5 | B | A | B |

TABLE 1-continued

| | | Configuration | Film Thickness of Reaction Suppressing Layer (nm) | BaGeO$_3$ | Ra | Ic |
|---|---|---|---|---|---|---|
| | 3-2 | YBCO/LMO/CeO$_2$/LMO/IBAD-MgO/GZO/Substrate | 10 | A | A | A |
| | 3-3 | YBCO/LMO/CeO$_2$/LMO/IBAD-MgO/GZO/Substrate | 30 | A | A | A |
| | 3-4 | YBCO/LMO/CeO$_2$/LMO/IBAD-MgO/GZO/Substrate | 60 | A | A | A |
| | 3-5 | YBCO/LMO/CeO$_2$/LMO/IBAD-MgO/GZO/Substrate | 80 | A | A | A |
| | 3-6 | YBCO/LMO/CeO$_2$/LMO/IBAD-MgO/GZO/Substrate | 100 | A | A | A |
| | 3-7 | YBCO/LMO/CeO$_2$/LMO/IBAD-MgO/GZO/Substrate | 180 | A | B | B |
| Comparative Example | 1 | YBCO/CeO$_2$/IBAD-GZO/Substrate | — | C | A | C |
| | 2 | YBCO/CeO$_2$/IBAD-MgO/GZO/Substrate | — | C | A | C |
| | 3 | YBCO/CeO$_2$/LMO/IBAD-MgO/GZO/Substrate | — | C | A | C |

Example 1-1 to Example 1-7

In each of Examples 1-1 to 1-7, a HASTELLOY metal substrate as the substrate 10 was introduced into an IBAD device, and the IBAD device was vacuumed to 1×10$^{-3}$ Pa. Then, a biaxially-oriented layer 24 made of GZO was deposited by an IBAD method with the use of GZO as an evaporation source at room temperature and a wire rod conveying speed of 10 m/h to have a film thickness of 700 nm. In some cases, the biaxially-oriented layer 24 is referred to as IBAD-GZO. In Example 1, the bed layer 22 was not formed.

Subsequently, the substrate 10 on which the biaxially-oriented layer 24 is deposited was introduced into a sputtering device, and the sputtering device was vacuumed to 1×10$^{-3}$ Pa. Then, a cap layer 26 made of CeO$_2$ was deposited by an RF sputtering method with the use of CeO$_2$ as an evaporation source to have a film thickness of 500 nm.

Specifically, deposition of the CeO$_2$ film by the RF sputtering method was performed under conditions of a temperature of about 700° C., an atmosphere of mixed gas of argon and oxygen of about 0.3 Pa, sputtering output of about 800 W, and a wire rod conveying speed of 7 m/h or less.

Next, the substrate 10 over which the cap layer 26 is deposited was introduced into an RF sputtering device, and the RF sputtering device was vacuumed to 1×10$^{-3}$ Pa. Then, a reaction suppressing layer 28 made of cubic LMO was deposited by an RF sputtering method with the use of LMO as an evaporation source to have respective film thicknesses.

Specifically, deposition of the LMO film by the RF sputtering method was performed under conditions of a temperature of about 900° C., an atmosphere of Ar gas of about 0.5 Pa, sputtering output of about 200 W, and a wire rod conveying speed of from 10 m/h to 360 m/h. The film thicknesses were set to be 5, 10, 30, 60, 80, 100 and 180 nm, respectively.

Finally, the substrate 10 over which the reaction suppressing layer 28 is deposited was introduced into an MOCVD device, and, with the use of (Y$_{0.7}$Gd$_{0.3}$)Ba$_2$Cu$_3$O$_{7-\delta}$ (hereinafter, referred to as YBCO) as an evaporation source, an oxide superconducting layer 30 made of YBCO was deposited by an MOCVD method to have a film thickness of 1000 nm.

Specifically, deposition of the YBCO film by the MOCVD method was performed under conditions of a temperature of about 800° C., an atmosphere of O$_2$ gas, and a wire rod conveying speed within the range of from 10 m/h to 500 m/h.

The superconducting wire rod according to each of Examples 1-1 to 1-7 of the invention was obtained through the above manufacturing processes.

Example 2

A HASTELLOY metal substrate as the substrate 10 was introduced into an ion-beam sputtering deposition device, and the ion-beam sputtering deposition device was vacuumed to 1×10$^{-3}$ Pa. Then, a bed layer 22 made of GZO was deposited by an ion-beam sputtering method with the use of GZO as an evaporation source at room temperature and a wire rod conveying speed of 30 m/h to have a film thickness of 100 nm.

Next, the substrate 10 on which the bed layer 22 is deposited was introduced into an IBAD device, and the IBAD device was vacuumed to 1×10$^{-4}$ Pa. Then, a biaxially-oriented layer 24 made of MgO was deposited by an IBAD method with the use of MgO as an evaporation source at room temperature and a wire rod conveying speed of 80 m/h to have a film thickness of 5 nm.

Then, a cap layer 26, a reaction suppressing layer 28, and an oxide superconducting layer 30 were deposited on the biaxially-oriented layer 24 in this order in a manner similar to Example 1. However, a film thickness of the reaction suppressing layer 28 was changed to 60 nm.

The superconducting wire rod according to Example 2 of the invention was obtained through the above manufacturing processes.

Examples 3-1 to 3-7

A HASTELLOY metal substrate as the substrate 10 was introduced into an ion-beam sputtering deposition device, and the ion-beam sputtering deposition device was vacuumed to 1×10$^{-3}$ Pa. Then, a bed layer 22 made of GZO was deposited by an ion-beam sputtering method with the use of GZO as an evaporation source at room temperature and a wire rod conveying speed of 30 m/h to have a film thickness of 100 nm.

Next, the substrate 10 on which the bed layer 22 is deposited was introduced into an IBAD device, and the IBAD device was vacuumed to 1×10$^{-4}$ Pa. Then, a biaxially-oriented layer 24 made of MgO was deposited by an IBAD method with the use of MgO as an evaporation source at room temperature and a wire rod conveying speed of 80 m/h to have a film thickness of 5 nm.

Next, the substrate 10 over which the biaxially-oriented layer 24 is deposited was introduced into an RF sputtering device, and the RF sputtering device was vacuumed to 1×10$^{-3}$ Pa. Then, in order to improve the lattice matching properties of a cap layer 26 to be formed thereon, a lattice matching layer made of LMO was deposited by an RF sputtering method with the use of LMO as an evaporation source to have a film thickness of 30 nm.

Specifically, deposition of the LMO film by the RF sputtering method was performed under conditions of a temperature of about 900° C., an atmosphere of Ar gas of about 0.5 Pa, sputtering output of about 200 W, and a wire rod conveying speed of 60 m/h.

Then, a cap layer 26, a reaction suppressing layer 28, and an oxide superconducting layer 30 were deposited on the lattice matching layer in this order in a manner similar to Example 1. However, a film thickness of the reaction suppressing layer 28 in each of Examples 3-1 to 3-7 was varied. In particular, the film thicknesses were set to be 5, 10, 30, 60, 80, 100, and 180 nm, respectively.

The superconducting wire rod according to each of Examples 3-1 to 3-7 of the invention was obtained through the above manufacturing processes.

Comparative Examples 1 to 3

With respect to the configuration of the superconducting wire rod of Example 1, a superconducting wire rod having no reaction suppressing layer 28 was manufactured as Comparative Example 1.

With respect to the configuration of the superconducting wire rod of Example 2, a superconducting wire rod having no reaction suppressing layer 28 was manufactured as Comparative Example 2.

With respect to the configuration of the superconducting wire rod of Examples 3, a superconducting wire rod having no reaction suppressing layer 28 was manufactured as Comparative Example 3.

As shown in Table 1, the configurations of the respective intermediate layers 20 of Comparative Examples 1 to 3 differ from one another.

Evaluation Methods and Evaluation Results

Hereinafter, evaluation methods and evaluation results of the respective superconducting wire rods manufactured in Examples 1-1 to 1-7, Example 2, Examples 3-1 to 3-7, and Comparative Examples 1 to 3 are described.

(1) X-ray Diffraction Measurement

With respect to the oxide superconducting layer 30 of the superconducting wire rod according to each of the Examples and Comparative Examples, an X-ray diffraction measurement was performed by using an X-ray diffractometer RINT-ULTIMA III manufactured by Rigaku Corporation.

Specifically, the measurement was performed with the X-ray diffractometer by using CuKα ray under conditions of a tube voltage of 40 kV, a tube current of 40 mA, a scanning speed of 2.0 deg/min, a receiving slit of 0.15 mm, and a scanning range 2θ of 5° to 135° to obtain an X-ray diffraction pattern of each superconducting wire rod.

The measurement revealed that each superconducting layer 30 is formed of a YBCO oxide superconductor.

The results of precipitation (generation) of an impurity $BaCeO_3$ are shown in Table 1 above. In Table 1, the case in which no peaks belonging to $BaCeO_3$ was observed, the case in which a maximum peak of $BaCeO_3$ is more than 0 cps and less than 100 cps, and the case in which a maximum peak of $BaCeO_3$ is 100 cps or more in each X-ray diffraction pattern are indicated by "A", "B" and "C", respectively.

The results shown in Table 1 confirmed that the generation of the impurity $BaCeO_3$ is suppressed in the superconducting wire rod according to each of Examples 1-1 to 1-7, 2, and 3-1 to 3-7 including the reaction suppressing layer 28, compared to the superconducting wire rod according to each of Comparative Examples 1 to 3 not including the reaction suppressing layer 28. Moreover, it was confirmed that the superconducting wire rod of each of Examples 1-2 to 1-7, 2, and 3-2 to 3-7, which includes the reaction suppressing layer 28 having a thickness of 10 μm or more, is preferable in that the generation of the impurity $BaCeO_3$ is completely suppressed.

(2) Surface Roughness Measurement

With respect to the superconducting wire rod according to each of the Examples and Comparative Examples, surface roughness Ra of each reaction suppressing layer 28 was determined using an AFM image thereof obtained with an atomic force microscope (AFM)(MOBILE S manufactured by Nanosurf AG). Here, the surface roughness Ra is given as arithmetic average roughness in 12.3 μm square of the AFM image of each reaction suppressing layer 28. The measurement was performed before depositing the oxide superconducting layer 30 on each reaction suppressing layer 28.

The measurement results are shown in Table 1. In Table 1, the case in which Ra is less than 5 nm is indicated by "A", and the case in which Ra is 5 nm or more is indicated by "B".

The results shown in Table 1 confirmed that when the film thickness of the reaction suppressing layer 28 is 100 nm or less, the surface roughness Ra of the reaction suppressing layer 28 is low.

(3) Current Transport Properties

Current transport properties were evaluated based on the measurement of a critical current Ic of the obtained oxide superconducting wire rod (line width of 10 mm). The critical current Ic was measured by using a four-terminal method with the oxide superconducting wire rod immersed in liquid nitrogen. Voltage terminals: 1 cm. Electric field criterion: 1 μV/cm.

The measurement results are shown in Table 1 above. In Table 1, the case in which the critical current Ic is 250 A or more is indicated by "A", the case in which the critical current Ic is 180 A or more and less than 250 A is indicated by "B", and the case in which the critical current Ic is less than 180 A is indicated by "C".

The results shown in Table 1 confirmed that the critical current Ic is improved in the superconducting wire rod according to each of Examples 1-1 to 1-7, 2, and 3-1 to 3-7 including the reaction suppressing layer 28, compared to the superconducting wire rod according to Comparative Examples 1 to 3 not including the reaction suppressing layer 28. It is thought that this is because the generation of the impurity $BaCeO_3$ is suppressed. Furthermore, it was confirmed that, among Examples 1-1 to 1-7, 2, and 3-1 to 3-7, the critical current Ic is improved in the superconducting wire rod of each of Examples 1-2 to 1-7, 2, and 3-2 to 3-7 in which the impurity $BaCeO_3$ was not generated, compared to the critical current Ic in the superconducting wire rod of each of Examples 1-1 and 3-1 in which the impurity $BaCeO_3$ was generated.

In the Examples according to the invention, the lattice constant of the reaction suppressing layer 28 is about 0.39 nm, the lattice constant of the oxide superconducting layer 30 is from about 0.38 nm to about 0.39 nm, and the lattice constant of the cap layer 26 made of $CeO_2$ is about 0.38 nm. It is thought that favorable crystal orientation was achieved in the oxide superconducting layer 30 (upper layer) because the reaction suppressing layer 28 formed between the cap layer 26 and the oxide superconducting layer 30 has a lattice constant close to that of the cap layer 26 (lower layer) and that of the oxide superconducting layer 30 (upper layer).

In contrast, in the Comparative Examples, the lattice constant of $BaCeO_3$ generated between the oxide superconducting layer 30 and the cap layer 26 is about 0.44 nm. As a result, in the oxide superconducting layer 30, the crystal axes of an oxide superconductor deposited on $BaCeO_3$ were not oriented in a constant direction, and thus Ic was decreased. Moreover, a superconducting current does not flow through an area formed of $BaCeO_3$ where the oxide superconducting layer 30 would have been formed, and thus Ic of the superconducting wire rod in the comparative examples was decreased.

While $BaCeO_3$ was generated in Examples 1-1 and 3-1, the amount thereof was small. Therefore, influence on decrease in current paths in the oxide superconducting layer 30 was small, and Ic was not drastically decreased.

In addition to the above Examples, when a composition of YBCO was changed from $(Y_{0.7}Gd_{0.3})Ba_2Cu_3O_{7-\delta}$ to $YBa_2Cu_3O_{7-\delta}$, the results similar to those of the above Examples were obtained. When $REBa_2Cu_3O_{7-\delta}$ (RE represents other than Y and Pr) was used instead of $YBa_2Cu_3O_{7-\delta}$, the results similar to those of the above Examples were obtained.

In addition, when the configuration of the biaxially-oriented layer 24 was changed from a single layer of IBAD-GZO to a double layer of IBAD-GZO and IBAD-YNbO, the results similar to those of the above Examples were obtained.

Furthermore, when $PrO_2$ is used as the constituent material for the cap layer 26 instead of $CeO_2$, the results similar to those of the above Examples were obtained.

It is thought that favorable crystal orientation was achieved in the oxide superconducting layer 30 (upper layer) as in the cases in which $CeO_2$ is used because the lattice constant of $PrO_2$ is about 0.38 nm. In contrast, in the superconducting wire rods that have configurations similar to those of the Comparative Examples except that $PrO_2$ is used instead of $CeO_2$, it was confirmed that $BaPrO_3$ was generated between the oxide superconducting layer 30 and the cap layer 26, and Ic was decreased. It is thought that current paths in the oxide superconducting layer 30 were reduced and Ic was decreased because a lattice constant of $BaPrO_3$ is about 0.43 nm.

REFERENCE SIGNS LIST 10 metal substrate
20 intermediate layer
26 cap layer
28 reaction suppressing layer
30 oxide superconducting layer

The invention claimed is:

1. A superconducting wire rod comprising:
    a metal substrate;
    an intermediate layer formed on the metal substrate and comprising a rare-earth element that reacts with Ba;
    a reaction suppressing layer formed on the intermediate layer and comprising $LaMnO_{3+\delta 1}$, wherein $\delta 1$ represents an amount of non-stoichiometric oxygen; and
    an oxide superconducting layer formed on the reaction suppressing layer and comprising an oxide superconductor comprising Ba,
    wherein an outermost layer of the intermediate layer at an oxide superconducting layer side is a cap layer comprising $CeO_2$, $PrO_2$, or both.

2. The superconducting wire rod according to claim 1, wherein the oxide superconductor is $REBa_2Cu_3O_{7-\delta 2}$, wherein RE represents a single rare-earth element or a plurality of rare-earth elements, and $\delta 2$ represents an amount of non-stoichiometric oxygen.

3. The superconducting wire rod according to claim 1, wherein the reaction suppressing layer has a thickness of from 10 nm to 100 nm.

4. The superconducting wire rod according to claim 1, wherein the reaction suppressing layer is thinner than the cap layer.

5. The superconducting wire rod according to claim 1, wherein a crystal lattice of the $LaMnO_{3+\delta 1}$ is a cubic or orthorhombic lattice.

6. The superconducting wire rod according to claim 1, wherein a proportion of the $LaMnO_{3+\delta 1}$ in the reaction suppressing layer is 80% by mass or more.

7. The superconducting wire rod according to claim 1, wherein $\delta 1$ is from 0 to 1.

8. The superconducting wire rod according to claim 2, wherein the rare-earth element is at least one selected from the group consisting of Y, Nd, Sm, Eu, Gd, Dy, Ho, Er, Tm, Yb, and Lu.

9. The superconducting wire rod according to claim 8, wherein the rare-earth element is Y.

10. The superconducting wire rod according to claim 2, wherein $\delta 2$ is from 0 to 1.

11. The superconducting wire rod according to claim 1, wherein the cap layer has a film thickness of from 50 nm to 600 nm.

12. The superconducting wire rod according to claim 5, wherein the crystal lattice is a cubic lattice.

13. The superconducting wire rod according to claim 1, wherein the reaction suppressing layer comprises 10% or less of a rare-earth element that reacts with Ba.

14. The superconducting wire rod according to claim 1, wherein
    the intermediate layer further comprises a bed layer at the metal substrate side and a biaxially-oriented layer between the bed layer and the cap layer; and
    the cap layer comprises the rare-earth element that reacts with Ba.

15. The superconducting wire rod according to claim 1, wherein
    the intermediate layer further comprises a biaxially-oriented layer at the metal substrate side; and
    the cap layer comprises the rare-earth element that reacts with Ba.

16. The superconducting wire rod according to claim 1, wherein the reaction suppressing layer has a porosity of 5% or less.

17. The superconducting wire rod according to claim 14, wherein the intermediate layer further comprises a lattice matching layer between the biaxially-oriented layer and the cap layer.

18. The superconducting wire rod according to claim 17, wherein the lattice matching layer comprises $LaMnO_{3+\delta 1}$, where $\delta 1$ represents an amount of non-stoichiometric oxygen.

19. A method for manufacturing a superconducting wire rod, the method comprising:
    forming, on a metal substrate, an intermediate layer comprising a rare-earth element that reacts with Ba;
    forming, on the intermediate layer, a reaction suppressing layer comprising $LaMnO_{3+\delta 1}$, wherein $\delta 1$ represents an amount of non-stoichiometric oxygen; and
    forming, on the reaction suppressing layer, an oxide superconducting layer comprising Ba,
    wherein an outermost layer of the intermediate layer at an oxide superconducting layer side is a cap layer comprising $CeO_2$, $PrO_2$, or both.

* * * * *